(12) United States Patent
Harrah et al.

(10) Patent No.: US 7,719,021 B2
(45) Date of Patent: May 18, 2010

(54) LIGHT EFFICIENT LED ASSEMBLY INCLUDING A SHAPED REFLECTIVE CAVITY AND METHOD FOR MAKING SAME

(75) Inventors: Shane Harrah, Mill Creek, WA (US); Greg Blonder, Summit, NJ (US)

(73) Assignee: Lighting Science Group Corporation, Satellite Beach, FL (US)

( * ) Notice: Subject to any disclaimer, the term of this patent is extended or adjusted under 35 U.S.C. 154(b) by 112 days.

(21) Appl. No.: 11/847,033

(22) Filed: Aug. 29, 2007

(65) Prior Publication Data

US 2008/0062701 A1 Mar. 13, 2008

Related U.S. Application Data

(63) Continuation-in-part of application No. 11/474,187, filed on Jun. 23, 2006.

(60) Provisional application No. 60/694,740, filed on Jun. 28, 2005.

(51) Int. Cl.
*H01L 33/00* (2006.01)
*H01L 21/00* (2006.01)
*H01L 33/48* (2006.01)

(52) U.S. Cl. .................. 257/98; 438/29; 257/E33.056; 257/E33.068; 257/E21.499

(58) Field of Classification Search .................. 257/98, 257/E21.499, E33.068, E33.056; 438/29
See application file for complete search history.

(56) References Cited

U.S. PATENT DOCUMENTS

| 5,050,946 | A | 9/1991 | Hathaway et al. |
|---|---|---|---|
| 5,217,811 | A | 6/1993 | Filas et al. |
| 5,581,876 | A | 12/1996 | Prabhu et al. |
| 5,725,808 | A | 3/1998 | Tormey et al. |
| 5,883,684 | A | 3/1999 | Millikan et al. |
| 5,953,203 | A | 9/1999 | Tormey et al. |
| 6,270,831 | B2 | 8/2001 | Kumar et al. |
| 6,274,890 | B1 | 8/2001 | Oshio et al. |
| 6,455,930 | B1 | 9/2002 | Palanisamy et al. |
| 6,518,502 | B2 | 2/2003 | Hammond et al. |
| 6,536,909 | B1 | 3/2003 | Azorin et al. |
| 6,805,456 | B2 | 10/2004 | Okuwaki et al. |
| 6,854,854 | B2 | 2/2005 | Hoelen et al. |
| 7,098,483 | B2 | 8/2006 | Mazzochette et al. |
| 7,163,331 | B2 | 1/2007 | Suzuki et al. |
| 7,217,025 | B2 | 5/2007 | Kim et al. |
| 7,293,906 | B2 | 11/2007 | Mok et al. |
| 2003/0049007 | A1 | 3/2003 | Sommers et al. |
| 2003/0219207 | A1 | 11/2003 | Guy |
| 2004/0043693 | A1 | 3/2004 | Ohkubo et al. |

(Continued)

FOREIGN PATENT DOCUMENTS

WO   WO-2006/132147   12/2006

*Primary Examiner*—Evan Pert
(74) *Attorney, Agent, or Firm*—Cantor Colburn LLP

(57) ABSTRACT

A method for making an efficient light emitting diode (LED) assembly by providing a thermally conductive base having a surface cavity, disposing a reflective paste in the surface cavity, and shaping the reflective paste to form a reflective cavity. The reflective cavity is shaped such that there is a mounting region and at least one reflective side wall at least partially surrounding the mounting region. Once shaped, the reflective paste is fired to set the reflective cavity in its shaped form. Next, one or more LED die may be mounted on the mounting region of the reflective cavity such that the emitted light is reflected by the side walls, thus increasing the light output of the LED assembly.

26 Claims, 3 Drawing Sheets

U.S. PATENT DOCUMENTS

| | | |
|---|---|---|
| 2004/0066645 A1 | 4/2004 | Graf et al. |
| 2004/0071437 A1 | 4/2004 | Tamura et al. |
| 2004/0109306 A1 | 6/2004 | Lee |
| 2004/0246696 A1 | 12/2004 | Yoo |
| 2004/0246744 A1 | 12/2004 | Krupa et al. |
| 2005/0007756 A1 | 1/2005 | Yu et al. |
| 2005/0063187 A1* | 3/2005 | Weng et al. ................ 362/296 |
| 2005/0093146 A1* | 5/2005 | Sakano ...................... 257/730 |
| 2005/0121686 A1* | 6/2005 | Keller et al. ................. 257/99 |
| 2005/0135116 A1 | 6/2005 | Epstein et al. |
| 2005/0141244 A1 | 6/2005 | Hamada et al. |
| 2006/0158901 A1 | 7/2006 | Wang |
| 2007/0007558 A1 | 1/2007 | Mazzochette |
| 2007/0158674 A1* | 7/2007 | Taguchi et al. ............... 257/99 |
| 2007/0189007 A1* | 8/2007 | Nishimoto et al. .......... 362/227 |
| 2008/0079018 A1* | 4/2008 | Kimura et al. ............... 257/98 |

* cited by examiner

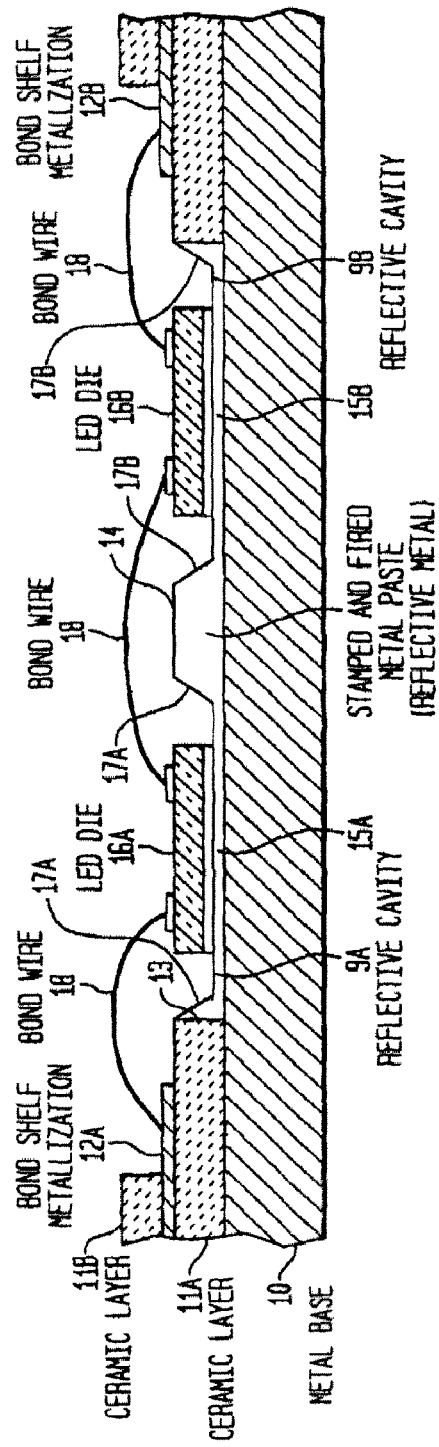
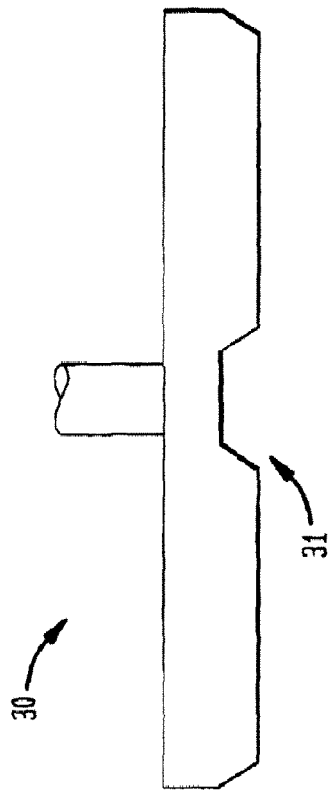

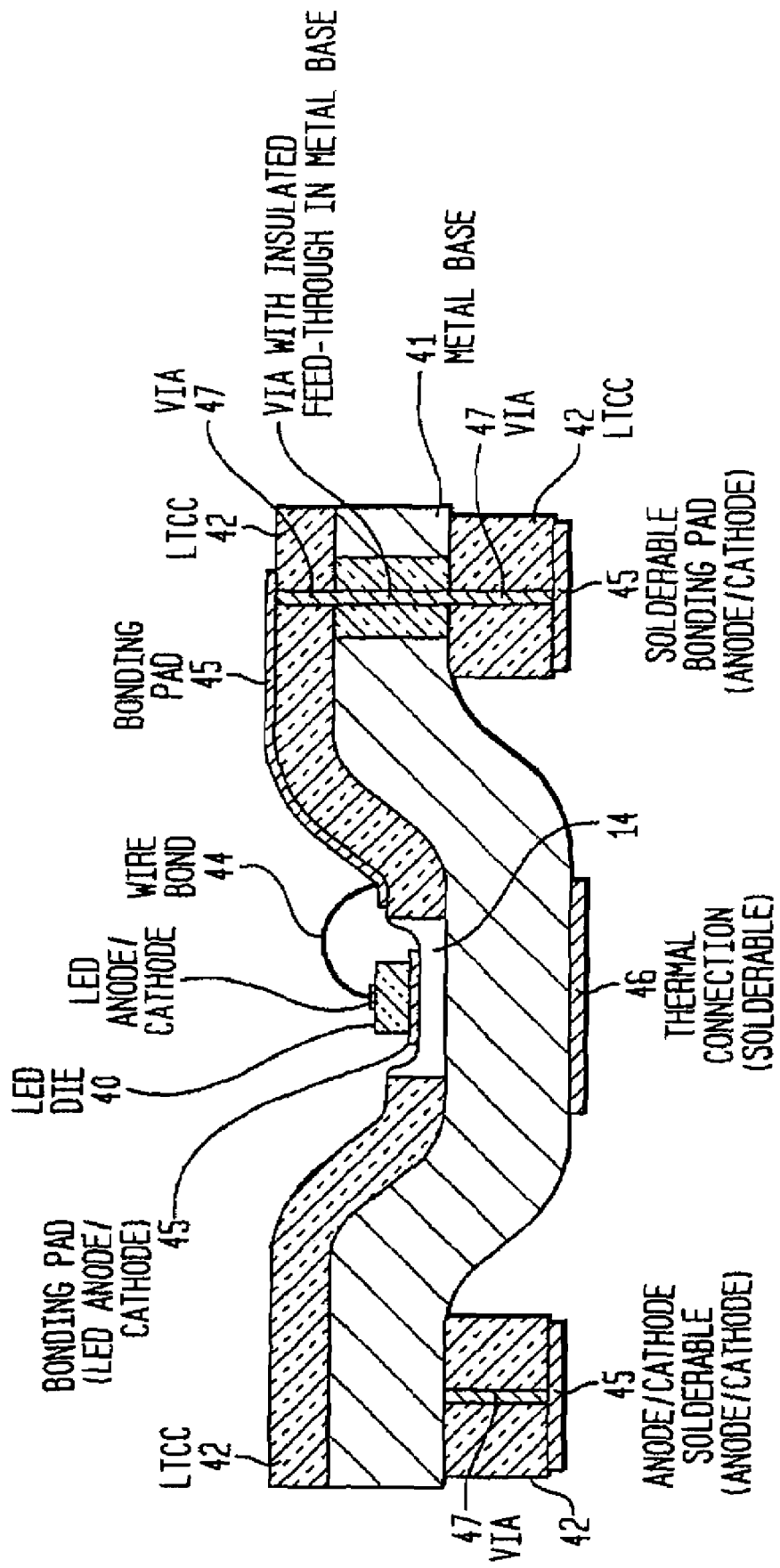

LIGHT EFFICIENT LED ASSEMBLY INCLUDING A SHAPED REFLECTIVE CAVITY AND METHOD FOR MAKING SAME

CROSS REFERENCE TO RELATED APPLICATIONS

This application is a continuation in part of U.S. patent application Ser. No. 11/474,187, filed Jun. 23, 2006, which in turn claims priority from provisional U.S. Patent Application No. 60/694,740 filed Jun. 28, 2005, the entire content of both of which are hereby incorporated herein in their entirety.

FIELD OF THE INVENTION

This invention relates to assemblies of light emitting diodes (LEDs) and, in particular, to a method of making an LED assembly of enhanced light efficiency. The method is particularly useful in making light efficient LED assemblies packaged for high temperature operation.

BACKGROUND OF THE INVENTION

An advantageous approach to fabricating assemblies including one or more light emitting diode (LED) die involves providing a thermally conductive base and mounting the one or more LED die on the base or within one or more cavities formed in an insulating layer overlying the metal base. The LED dice are thermally coupled to the metal base and heat from the dice is rapidly conducted through the metal base to one or more heat sinks. This approach may use as the thermally conductive base a substrate made using low temperature cofired ceramic-on-metal technology (LTCC-M), which is described in greater detail in U.S. Pat. No. 6,455,930 issued to Ponnuswamy et al. on Sep. 24, 2002 which is incorporated herein by reference. The resulting LED assemblies are particularly useful for high temperature operation. Alternatively, this approach may be used with any LED packaging technique that uses a thermally conductive base, such as metal base. According to an embodiment of the present invention, the base may be an LTCC-M substrate.

When using LTCC-M technology, mounting the LED die in close thermal coupling with the metal base is highly advantageous, but the die are peripherally circumscribed by ceramic cavity side walls. These side walls, unfortunately, absorb a significant amount of the light emitted from the LED die positioned within the cavity, thus reducing the amount of light emitted by the assembly.

One approach to increasing the light output is to attach a miniature metal reflector into each cavity of the ceramic-on-metal substrate. However this approach adds component costs (the reflector) and assembly costs (the depositing of adhesive, the placing of the reflector into the cavity and the curing of the adhesive). Accordingly there is a need for an improved method of increasing the light output of LED assemblies.

SUMMARY OF THE INVENTION

In accordance with the invention, an improved method of enhancing the efficiency of a metal or ceramic-on-metal supported LED assembly comprises the steps of providing a thermally conductive base, optionally including at least one surface cavity, with one or more surface cavities therein, depositing a reflective paste onto the base or into each surface cavity, shaping the reflective paste with a shaping tool and firing the paste to form a shaped reflector cavity having a mounting region at least partially surrounded by at least one reflective side wall.

According to an embodiment of the present invention, the shaping tool may include a surface comprising a non-stick material (e.g., TEFLON®). The shaping tool may further comprise one or more substantially flat surfaces surrounded by peripheral surfaces at an obtuse angle (e.g., 135°). According to an embodiment of the present invention, the shaping tool may be removed before or after firing. Each LED die is then mounted on a flat surface formed by the tool and light is reflected by the peripheral surfaces formed at the obtuse angle.

BRIEF DESCRIPTION OF THE DRAWINGS

The advantages, nature and various additional features of the invention will appear more fully upon consideration of the illustrative embodiments now to be described in detail in connection with the accompanying drawings. In the drawings:

FIG. 2 is a schematic cross-section of an exemplary packaged LED assembly fabricated according to the process illustrated in FIG. 1, according to an embodiment of the present invention;

FIG. 3 illustrates an exemplary shaping tool, according to an embodiment of the present invention; and FIG. 4 illustrates an LTCC-M packaged assembly, according to an embodiment of the present invention.

DETAILED DESCRIPTION OF THE DRAWINGS

Figure 1:
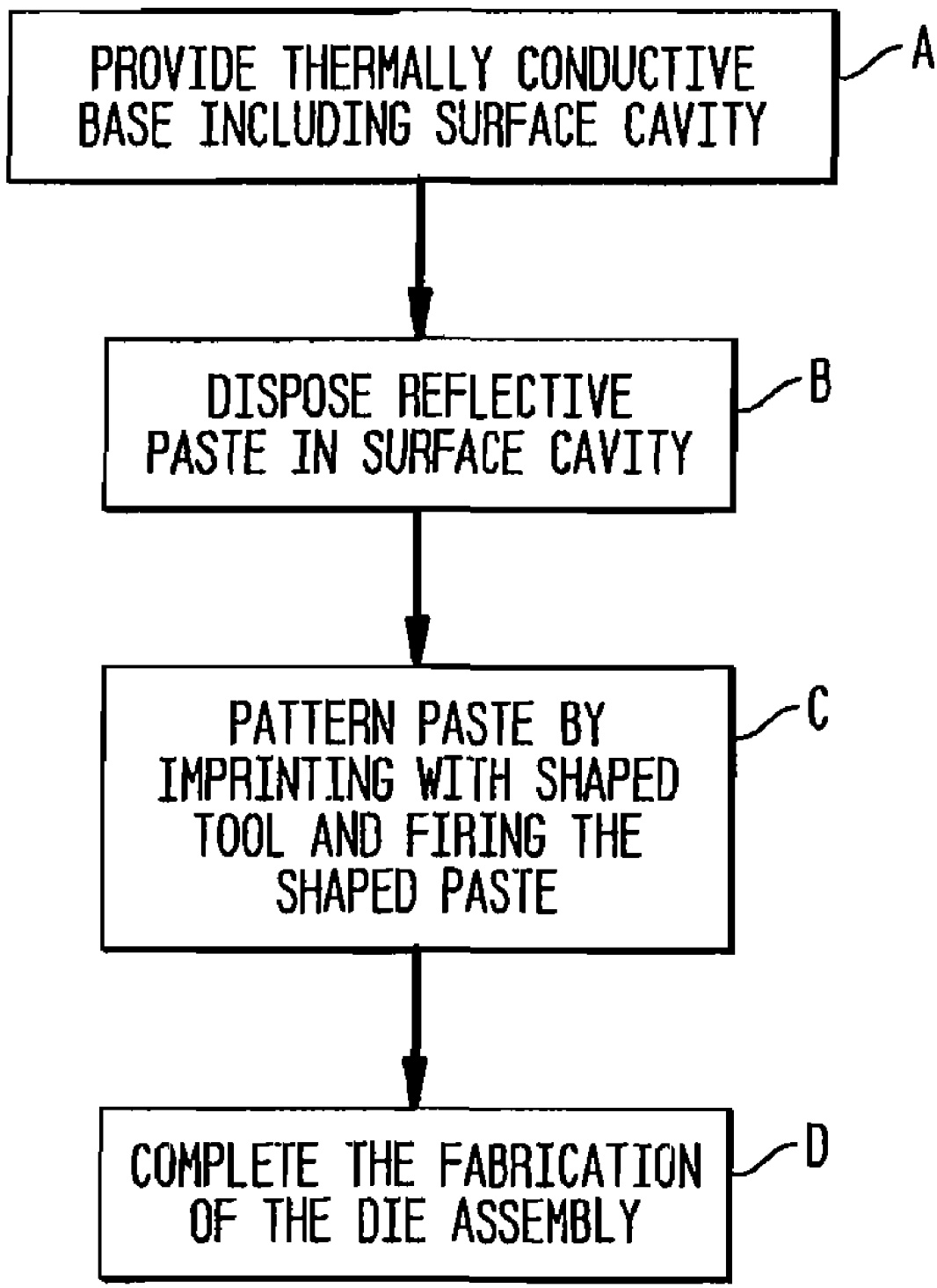
FIG. 1 is a schematic block diagram of the steps involved in fabricating an LED assembly packaged for enhanced light efficiency, according to an embodiment of the present invention.

This description is divided into two parts. Part I describes a method for fabricating a light emitting diode (LED) assembly having a shaped reflective cavity, and Part II describes the fabrication of a LTCC-M packaged assembly having a shaped reflective cavity, as one embodiment of the present invention.

Referring to the drawings, FIG. 1 is a schematic block diagram of the steps involved in fabricating in light efficient LED assembly having a shaped reflective cavity, according to an embodiment of the present invention. According to an embodiment of the present invention, a thermally conductive base including one or more surface cavities is provided, as shown in step A. According to an embodiment of the present invention, the thermally conductive base may be composed of any suitable thermally conductive material. Preferably, the thermally conductive base is an unfired ceramic-on-metal substrate. According to an embodiment of the present invention wherein the thermally conductive base includes a ceramic-on-metal substrate, the one or more surface cavities may be punched-out regions of the ceramic layer of the ceramic-on-metal substrate. Alternatively, a metal base without ceramic layers may be used.

Next, as shown in step B, a reflective paste is disposed in the one or more surface cavities of the thermally conductive base. According to an embodiment of the present invention, the reflective paste may be composed of any suitable metallic material, such as, for example, a silver-based or aluminum-based paste. Preferably, the reflective paste is composed of a thermally conductive metal. The reflective paste may be disposed in the surface cavity by any suitable deposition method, such as, for example, by dispensation through a syringe or by pad printing. In an alternative embodiment employing a metal base without a surface cavity, the reflective paste is applied to the surface of the base.

As shown in step C, the reflective paste is shaped or patterned to form a reflector cavity including at least one mounting region for mounting one or more LED die thereon, and at least one reflective side wall at least partially surrounding each mounting region. According to an embodiment of the present invention, the reflective paste may be shaped into any desirable shape to enhance or direct the reflection of light from the LED die, by any suitable technique, such as by imprinting using a shaping tool. Next, the reflective paste is fired to set or harden the paste in its shaped form.

The shaping or patterning may advantageously be effected by depressing or imprinting the reflective paste with an appropriately shaped tool. According to an embodiment of the present invention, the shaping tool may have one or more substantially flat surface regions for forming the mounting regions and one more angled or curved surfaces for forming the reflective side walls that at least partially surround the mounting region. According to an embodiment of the present invention, the shaping tool is shaped to form at least one reflective side wall which is arranged at an obtuse angle relative to the mounting region. The shaping tool advantageously includes a non-stick surface, composed of or coated with a suitable non-stick material, such as, for example polytetrafluoroethylene (e.g., TEFLON®), so that the reflective paste does not stick to the shaping tool when it is withdrawn from the reflective paste. One having ordinary skill in the art will appreciate that the shaping tool may be removed from the reflective paste either before or after firing the reflective paste.

According to an embodiment of the present invention, depending on how reflective the reflective paste is after firing, it may be desirable to imprint or stamp the reflective paste again with a similarly shaped tool after firing, to reduce the roughness of the reflective cavity surface.

According to an embodiment of the present invention, the reflective side wall(s) may be coated with a film or layer of a high reflectivity coating, such as silver or aluminum.

As shown in step D of FIG. 1, fabrication of the LED assembly is completed by one or more LED die on the mounting region of the reflective cavities. According to an embodiment of the present invention, the LED die may be electrically connected to conventional power and control circuitry, as by wire bonding to metallization regions disposed on the ceramic layer of the thermally conductive base, or by alternative means to conventional printed wire boards adjacent to or overlying the base.

FIG. 2 illustrates an exemplary LED assembly fabricated according to the method described above. According to an embodiment of the present invention, the LED assembly comprises a thermally conductive base 10. One having ordinary skill in the art will appreciate that the thermally conductive base 10 may be composed of any suitable thermally conductive material, such as, for example, a metal substrate (e.g., a Cu/Mo/Cu substrate) supporting one or more overlying ceramic layers 11A and 11B including one or more metallization layers 12A, 12B. Alternatively, the ceramic layer 11A and 11B is substituted with a layer of electrically insulating material such as a fiberglass reinforced, epoxy printed wire board (PWB). The thermally conductive base 10 includes a surface cavity 13 defined therein. For example, according to an embodiment of the present invention wherein the thermally conductive base 10 is comprised of an LTCC-M substrate or structure, the surface cavity 13 may be defined by an opening in one or more ceramic layers of the LTCC-M substrate. Alternatively, a metal base without a surface cavity may be used.

A reflective layer 14, preferably including the reflective paste, is disposed in the surface cavity 13 and shaped (i.e., using a shaping tool as described above) to form one or more reflective cavities 9A, 9B. Each reflective cavity 9A, 9B is shaped such that it includes one or more mounting regions 15A, 15B at least partially surrounded by at least one reflective side wall 17A, 17B. One having ordinary skill in the art will appreciate that the mounting region 15A, 15B comprises a substantially flat surface upon which the one or more LED die 16A, 16B may be mounted. As shown in FIG. 2, the reflective side walls 17A, 17B at least partially surround or circumscribe the LED die 16A, 16B such that the light emitted by the LED die 16A, 16B is reflected.

According to an embodiment of the present invention, the reflective side walls 17A, 17B may be arranged at an obtuse angle relative to the mounting region 15A, 15B to more effectively reflect the light emitted by the LED die 16A, 16B out of the reflector cavity 9A, 9B.

According to an embodiment of the present invention, at least a portion of the exposed surface of the reflective layer 14 may include texture or roughening patterns to enhance the dispersion of light reflected from the reflective layer 14 for the purpose of increasing the uniform excitation of a phosphor.

FIG. 3 illustrates an exemplary shaping tool 30 according to an embodiment of the present invention. The shaping tool 30 may include a molding surface 31 having a surface pattern used to define the reflective side walls 17A, 17B of the reflective cavity 9A, 9B during the shaping process.

Alternatively, the reflective layer 14 may be a coined surface, produced by coining an area of the metal base 41, or by inserting a reflective coined disk into surface cavity 13 or directly onto metal base 41. The coined disk may be made of a material such as aluminum. The coined surface includes a raised area along at least part of the periphery of the coined surface, thereby forming the at least one reflective side wall 17A, 17B, and reflective cavity 9A, 9B in the areas of the coined surface not raised.

According to an embodiment of the present invention the LED die 16A, 16B may be electrically connected to one or more metallization layers 12A, 12B by any suitable connection means, including but not limited to via wire bonds 18.

According to an embodiment of the present invention, the LED die 16A, 16B may be encapsulated by any suitable encapsulant, such as, for example, an epoxy or silicone.

LTCC-M Packaging

According to an embodiment of the present invention, the thermally conductive base mounting structure is advantageously a LTCC-M substrate. The fabrication of LTCC-M mounting structures is described in detail below. Multilayer ceramic circuit boards are made from layers of green ceramic tapes. A green tape is made from particular glass compositions and optional ceramic powders, which are mixed with organic binders and a solvent, cast and cut to form the tape. Wiring patterns can be screen printed onto the tape layers to carry out various functions. Vias are then punched in the tape and are filled with a conductor ink to connect the wiring on one green tape to wiring on another green tape. The tapes are then aligned, laminated, and fired to remove the organic materials, to sinter the metal patterns and to crystallize the glasses. This is generally carried out at temperatures below about 1000° C., and preferably from about 750-950° C. The composition of the glasses determines the thermal coefficient of expansion (TCE), the dielectric constant and the compatibility of the multilayer ceramic circuit boards to various electronic components. Exemplary crystallizing glasses with inorganic fillers that sinter in the temperature range 700 to 1000° C. are Magnesium Alumino-Silicate, Calcium Boro-Silicate, Lead Boro-Silicate, and Calcium Alumino-Boricate.

More recently, metal support substrates (metal boards) have been used to support the green tapes. The metal boards lend strength to the glass layers. Moreover since the green tape layers can be mounted on both sides of a metal board and can be adhered to a metal board with suitable bonding glasses, the metal boards permit increased complexity and density of circuits and devices. In addition, passive and active components, such as resistors, inductors, and capacitors can be incorporated into the circuit boards for additional functionality. Thus this system, known as low temperature cofired ceramic-metal support boards, or LTCC-M, has proven to be a means for high integration of various devices and circuitry in a single package. The system can be tailored to be compatible with devices including silicon-based devices, indium phosphide-based devices and gallium arsenide-based devices, for example, by proper choice of the metal for the support board and of the glasses in the green tapes.

The ceramic layers of the LTCC-M substrate may be matched to the thermal coefficient of expansion (TCE) of the metal support board or metal base. Glass ceramic compositions are known that match the thermal expansion properties of various metal or metal matrix composites. Generally, LTCC-M substrates, structures, and materials are described in U.S. Pat. No. 6,455,930, "Integrated heat sinking packages using low temperature co-fired ceramic metal circuit board technology", issued Sep. 24, 2002 to Ponnuswamy, et al and assigned to Lamina Ceramics. U.S. Pat. No. 6,455,930 is incorporated by reference herein. The LTCC-M substrate is further described in U.S. Pat. Nos. 5,581,876, 5,725,808, 5,953,203, and 6,518,502, all of which are incorporated by reference herein.

The metal support boards used for LTCC-M technology do have a high thermal conductivity, but some metal boards have a high TCE, and thus a bare die cannot always be directly mounted to such metal support boards. However, some metal support boards are known that can be used for such purposes, such as metal composites of copper and molybdenum (including from 10-25% by weight of copper) or copper and tungsten (including 10-25% by weight of copper), made using powder metallurgical techniques. Copper clad Kovar®, a metal alloy of iron, nickel, cobalt and manganese, a trademark of Carpenter Technology, is a very useful support board. AlSiC is another material that can be used for direct attachment, as can aluminum or copper graphite composites.

According to an embodiment of the present invention, LTCC-M technology may be used to provide an integrated packaged assembly for the LED die and accompanying circuitry. Referring to FIG. 4, an LED die 40 may be mounted directly onto a shaped reflective cavity 9A,9B (as described above) which overlies a metal base 41 of the LTCC-M substrate. According to an embodiment of the present invention, the LTCC-M substrate includes, but is not limited to a metal base 41 incorporating passive components such as bonding pads 45, thermal connector pads 46, and conductive vias 47 through the multilayer ceramic portion 42, to connect the various components, i.e., LED die 40, circuits, heat sink and the like, in an integrated package. According to an embodiment of the present invention the metal base 41 comprises a material having a high thermal conductivity to act as a heat sink for the heat generated by the one or more LED die 40. The one or more LED die 40 may be electrically connected to one or more metallization layers or regions, such as bonding pad 45, disposed on the ceramic layer 42 by any suitable connection means, such as, for example, wire bond 44. One having ordinary skill in the art will appreciate that the one or more LED die may be indirectly attached to the metal base 41, for example, via a bonding pad 45. Optionally, the LTCC-M based LED package may be hermetically sealed with a suitable encapsulant (not shown).

According to an embodiment of the present invention, an integrated package may be formed which comprises a first and a second LTCC-M substrate. The first substrate may have mounted thereon a semiconductor device, and a multilayer ceramic circuit board with embedded circuitry for operating the component; and the second substrate has a heat sink or conductive heat spreader mounted thereon. Thermoelectric (TEC) plates (Peltier devices) and temperature control circuitry are mounted between the first and second substrates to provide improved temperature control of semiconductor devices. A hermetic enclosure can be adhered to the metal support board.

The use of LTCC-M technology can also utilize the advantages of flip chip packaging together with integrated heat sinking. The LTCC-M packages may be made smaller, cheaper and more efficiently than existing present-day packaging. Advantageously, the metal base serves as a heat spreader or heat sink. The flip chip may be mounted directly on the metal base, which is an integral part of the package, eliminating the need for additional heat sinking. A flexible circuit may be mounted over the bumps on the flip chip. The use of multilayer ceramic layers can also accomplish a fan-out and routing of traces to the periphery of the package, further improving heat sinking. High power integrated circuits and devices that have high thermal management needs can be used with this LTCC-M technology.

According to an embodiment of the present invention, the method of making a light efficient LED assembly comprises the steps of providing a thermally conductive base including at least one surface cavity for receiving at least one LED die. A reflective paste, typically a metallic paste, is disposed in the cavity, and the paste is shaped into a reflective cavity having at least one region for mounting the one or more LED die and one or more reflective side walls. The reflective side walls at least partially surround or circumscribe the mounting region and are arranged at an obtuse angle relative to the mounting region to efficient reflect the light emitted by the one or more LED die out of the reflective cavity. The reflective paste is fired, and the LED assembly is completed by mounting, connecting and encapsulating the one or more LED die in the reflective cavity.

Advantageously, the thermally conductive base comprises a ceramic-on-metal mounting base and the surface cavity comprises an opening in the ceramic. According to an embodiment of the present invention, the reflective paste may be disposed in the surface cavity of the base by any suitable technique, such as, for example, by injection molding. The reflective paste disposed in the surface cavity may be shaped by any suitable patterning technique, such as, for example, by pressing the reflective paste with a shaping tool having a molding surface adapted to define a mounting region and a circumscribing side wall region. The shaping tool advantageously comprises an anti-adhesive material (e.g., an anti-adhesive coating). According to an embodiment of the present invention, the shaping tool may be removed before firing, or, remain pressed into the reflective paste during firing. In addition, the shaping tool may also be pressed into the reflective paste, now formed into the reflective cavity, after firing to increase the surface smoothness of the fired paste.

The present application also relates to an LED assembly made according to the above described process. According to an embodiment of the present invention, the LED assembly may comprise a thermally conductive base including one or more surface cavities. The LED assembly further comprises a reflective cavity composed of a fired reflective paste formed in the surface cavity. The reflective cavity may include a substantially flat mounting region and one or more shaped reflective side walls at least partially circumscribing the mounting region. The LED assembly comprises at least one LED die mounted on the mounting region. Advantageously, the thermally conductive base comprises a LTCC-M structure, wherein the surface cavity is formed as an opening in the one or more ceramic layers of the LTCC-M structure.

According to an embodiment of the present invention, the LED assembly may include a printed wire board (PWB) disposed on the thermally conductive base. The PWB may include one or more layers, and have one or more apertures therethrough which form a surface cavity. A reflective cavity is formed in the LED assembly by disposing a reflective paste in the PWB surface cavity, and firing the paste. Optionally, one or more isolators or interposers may disposed in the surface cavity of the PWB and mounted on the base, either before or after disposition and firing of the reflective paste. Next, one or more LED die may be mounted on the isolator. According to an embodiment of the present invention, the isolator may comprise a material having a TCE that matches, or is approximately equal to the TCE of the one or more LED die mounted thereon.

One having ordinary skill in the art will appreciate that the isolator may be attached directly to the base according to any suitable attachment means or material, such as conductive epoxy, solder, brazing, mechanical means, etc. Further, one having ordinary skill in the art will appreciate that in fabrication, the isolator and LED die may be disposed on the base, followed by the disposition of the PWB onto the base such that the surface cavity of the PWB aligns with or corresponds to the isolator and LED die. It is understood that the above-described embodiments are illustrative of only a few of the many possible specific embodiments, which can represent applications of the invention. Numerous and varied other arrangements can be made by those skilled in the art without departing from the scope of the invention.

What is claimed is:

1. A method of making an LED assembly comprising the steps of:
   providing a thermally conductive base including at least one surface cavity;
   disposing a reflective paste in the at least one surface cavity;
   shaping the reflective paste to form at least one reflective cavity including a mounting region and at least one reflective side wall at least partially surrounding the mounting region;
   firing the reflective paste; and
   mounting one or more LED die on the mounting region.

2. The method of claim 1, further comprising the step of encapsulating the LED die.

3. The method of claim 1 wherein the thermally conductive base comprises a ceramic-on-metal mounting base and the surface cavity comprises an opening in the ceramic.

4. The method of claim 1, wherein the step of disposing the reflective paste comprises injecting the reflective paste into the surface cavity.

5. The method of claim 1, wherein the step of shaping comprises pressing the reflective paste with a shaping tool.

6. The method of claim 5, wherein the shaping tool comprises a molding surface having a surface pattern for patterning the reflective paste to form the mounting region and the at least one reflective side wall.

7. The method of claim 6, wherein the molding surface comprises an anti-adhesive material.

8. The method of claim 5, wherein the shaping tool remains pressed into the reflective paste during the firing step.

9. The method of claim 5, wherein after the firing step, the shaping tool is pressed into the reflective cavity to increase the smoothness of the reflective cavity.

10. The method of claim 1, wherein the thermally conductive base comprises a low temperature cofired ceramic-on-metal (LTCC-M) substrate.

11. The method of claim 1, further comprising the step of coating the at least one reflective side wall with a high reflectivity coating.

12. The method of claim 11, wherein the high reflectivity coating comprises silver.

13. An LED assembly made according to the method of claim 1.

14. An LED assembly comprising:
    a thermally conductive base including at least one surface cavity,
    at least one reflective cavity comprising a fired reflective paste disposed in the at least one surface cavity, wherein the reflective cavity includes a mounting region and at least one reflective side wall at least partially surrounding the mounting region; and
    at least one LED die mounted on the mounting region.

15. The LED assembly of claim 14, wherein the thermally conductive base comprises an LTCC-M substrate.

16. The LED assembly of claim 15, wherein the surface cavity is formed in one or more ceramic layers of the LTCC-M substrate.

17. The LED assembly of claim 14, wherein the thermally conductive base comprises a fiberglass reinforced, epoxy printed circuit board.

18. The LED assembly of claim 14, wherein the surface cavity is formed in a printed wire board.

19. An LED assembly comprising:
    a thermally conductive base;
    at least one reflective cavity disposed on a surface of the thermally conductive base, wherein the reflective cavity includes a mounting region and at least one reflective side wall at least partially surrounding the mounting region; and
    at least one LED die mounted on the mounting region;
    wherein the reflective cavity comprises a fired reflective paste.

20. The LED assembly of claim 19, wherein the reflective cavity comprises a reflective coined insert having a shape selected from the group consisting of rectangular and circular.

21. The LED assembly of claim 19, wherein the reflective cavity comprises a coined area of the thermally conductive base.

22. The LED assembly of claim 19, wherein a printed wiring board (PWB) disposed on the thermally conductive base forms a surface cavity within which the reflective cavity is disposed.

23. The LED assembly of claim 22, further comprising an isolator disposed in the PWB surface cavity.

24. The LED assembly of claim 23, wherein the isolator is composed of a material having a thermal coefficient of expansion (TCE) approximately equal to the TCE of the one or more LED die.

25. The LED assembly of claim 19, wherein the reflective cavity further comprises an exposed surface having a roughening pattern.

26. The LED assembly of claim 19, wherein the reflective cavity comprises a reflective coined insert having a predetermined shape.

* * * * *